United States Patent [19]
Coddington

[11] Patent Number: 6,147,540
[45] Date of Patent: Nov. 14, 2000

[54] HIGH VOLTAGE INPUT BUFFER MADE BY A LOW VOLTAGE PROCESS AND HAVING A SELF-ADJUSTING TRIGGER POINT

[75] Inventor: John Deane Coddington, Cedar Park, Tex.

[73] Assignee: Motorola Inc., Schaumburg, Ill.

[21] Appl. No.: 09/143,844

[22] Filed: Aug. 31, 1998

[51] Int. Cl.[7] ................................................ H03L 5/00
[52] U.S. Cl. ............................................................. 327/333
[58] Field of Search ..................................... 327/319–322, 327/328, 333; 326/62, 63, 68, 80–85

[56] References Cited

U.S. PATENT DOCUMENTS

| | | |
|---|---|---|
| 4,504,747 | 3/1985 | Smith et al. ............................ 307/475 |
| 4,853,560 | 8/1989 | Iwamura et al. ..................... 307/296.1 |
| 5,051,626 | 9/1991 | Kajii ........................................ 326/69 |
| 5,280,200 | 1/1994 | Tarng ....................................... 327/312 |
| 5,561,382 | 10/1996 | Ueda et al. ................................ 326/66 |
| 5,787,291 | 7/1998 | Moyer et al. ...................... 395/750.03 |
| 5,898,341 | 4/1999 | Miyashita ................................ 330/253 |
| 6,011,428 | 1/2000 | Tsukude et al. ......................... 327/541 |

Primary Examiner—My-Trang Nuton

[57] ABSTRACT

A high performance high input voltage input buffer manufacture using a low voltage process contains an input buffer circuit (136) and a level shifter (132). The input buffer (136) will receive an input signal via a chip pad (112). The input signal from trip pad (112) will be provided to an inverter stack (135) that contains or is coupled to protection transistors (116, 114, 110, and 111). The protection transistors are biased by a reference generator (134) which outputs a voltage that is a function of the maximal voltage that can be provided on the chip pad (112). By using the circuit (134), the trigger point of the inverter stack (135) can be dynamically adjusted for any OVDD (110) value whereby input buffer performance is improved and made more flexible.

12 Claims, 6 Drawing Sheets

HIGH VOLTAGE INPUT BUFFER MADE BY A LOW VOLTAGE PROCESS AND HAVING A SELF-ADJUSTING TRIGGER POINT

FIELD OF THE INVENTION

The present invention relates generally to integrated circuit design, and more particularly to, input buffer circuits on an integrated circuit.

BACKGROUND OF THE INVENTION

In the integrated circuit (IC) industry, input buffer circuitry is fabricated on a periphery of an integrated circuit die and electrically connected between an external pin of the integrated circuit and internal circuitry within the IC. In essence, the input buffer circuitry is an interface between the internal IC circuitry and an external environment outside of the IC so that data can be communicated from the external environment in to and out from the integrated circuit. Integrated circuits (ICs) are routinely designed such that one integrated circuit in an electrical system operates at a first power supply voltage and a second integrated circuit operates using a different power supply voltage level. For example, a first common voltage supply in the industry is roughly a 5 volt voltage supply, a second voltage supply used in the industry is roughly 3.3 volts, a third voltage commonly used in the industry is roughly 2.5 volts, and a fourth commonly used voltage supply level is roughly 1.8 volts where any electrical system may contain one or more devices operating at these voltage levels. As an example, for example, a 5 volt part will need to interface to a 1.8 volt part wherein the input buffer which is used to communicate between these two parts must be able to handle the discrepancy in voltage while still rendering acceptable performance. Due to the fact that there are at least four different common power supply voltage levels which are readily available in the industry, communication between these different devices has become more complex. Input and/or output buffer must now ensure interoperability of these different devices while maintaining optimal performance, if possible. Therefore, the design of such buffers has become increasingly more difficult and increasingly more important in the IC industry.

FIG. 1 illustrates a prior art input buffer 500 that is commonly used in the integrated circuit industry. The buffer of FIG. 1 is fabricated on an IC die and allows two integrated circuits with different power supply voltages to interface to one another in a fairly efficient manner. The integrated circuit incorporating the circuit 500 contains a chip pad 512 in FIG. 1 which is used to receive input data from external to the integrated circuit. An input signal provided to the chip pad/terminal 512 will pass through a resistive element 510 and be communicated through an input transistor 504 illustrated in FIG. 1. The transistor 504 of FIG. 1 has a gate/control electrode that is coupled to the outside VDD level (OVDD) 514. The OVDD signal 514 is the power supply voltage level used by the external peripheral that is coupled to the pad 512 and providing the data into the circuit 500. The OVDD signal 514 is provided into the integrated circuit via another pin coupled to the integrated circuit where the OVDD is not specifically illustrated in FIG. 1. As a typical example, OVDD may be one of 5 volts, 3.3 volts, 2.5 volts, and 1.8 volts in most devices that use complementary metal oxide semiconductor (CMOS) silicon logic devices.

The transistor 504 ensures that the node 505 does not rise in voltage to a damaging voltage level that can harm the transistors 508 and 506. Specifically, any voltage provided on the chip pad 512 through the resister 510 will drop at least a threshold voltage (Vt) in magnitude when communicated through the transistor 504 whereby the voltage on node 505 should be less than OVDD when OVDD 514 in FIG. 1 is greater than VDD 516. In short, transistor 504 will protect the transistors 508 and 506 from a damaging overvoltage occurrence that may occur when an integrated circuit operating at a first power voltage is coupled to another integrated circuit operating at a different second power supply voltage.

The input signal initially provided through the chip pad 512 is then provided via the node 505 to the inverter comprising transistors 506 and 508. The inverter, comprising transistors 506 and 508, is connected to a ground potential 520 and an internal VDD voltage 516. The VDD voltage 516 is a voltage that is supplied to operate all the circuitry on the integrated circuit including the input buffer 500. Typically, VDD 516 can be any voltage but is usually 2.5 volts or 1.8 volts in modern high performance low power microprocessors and memory. The inverter, comprising the transistors 506 and 508, will buffer the input signal to an internal node 518 with a logical inversion. This inverted signal provided by transistors 506 and 508 is routed to functional located within the integrated circuit containing the circuit 500 so that incoming information may be processed by the system.

In case where OVDD 514 minus a threshold voltage (OVDD−Vt) is substantially less than VDD 516 in voltage, the transistor 502 is provided. Transistor 502 will pull the node 505 up to an acceptable voltage during certain conditions to shut off the inverter comprising transistors 506 and 508 when (OVDD−Vt) is substantially less than VDD. Therefore, transistor 502 ensures that, when a substantial mismatch of voltage occurs between OVDD and VDD, the inverter containing transistors 506 and 508 can be completely turned off regardless of this extreme difference in voltage.

While the circuit of FIG. 1 is commonly used and is an adequate output buffer in most circumstances, the circuitry of FIG. 1 has many disadvantages. First, due to the difference voltages OVDD 514 and VDD 516, the inverter comprising transistors 506 and 508 is typically fixed to a trigger point that is directly a function of specific OVDD and VDD voltage values. For example, if OVDD is 5 volts and VDD is 3.3 volts, the trigger voltage of the inverter comprising gates 506 and 508 is statically fixed to roughly 2.5 volts, which is not half way between VDD and ground, when the devices 508 and 506 are matched. This is not advantageous since the inverter now has a trigger point that is not roughly half way between VDD 516 (3.3 volts) and ground 520. To compensate for this noise margin problem, the transistors 508 and 506 are fabricated with significantly different in aspect ratios to statically fix the trigger point at yet another voltage value (e.g., 1.6 volts). This mismatching of the transistors 506 and 508 will result in an imbalanced and non-symmetrical inverter that will have different operating characteristics when the inverter is transitioning from a high voltage to a low voltage and vice versa. Since timing constraints of external buses and the like are typically designed to the worse case transition, the mismatch in the transistors 506 and 508 to correct noise margins may impact the maximal speed at which the device can be operated.

In addition, since the trigger point of FIG. 1 is statically fixed, the circuitry of FIG. 1 can only function optimally when OVDD 514 and VDD 516 are known quantities that will not change for different applications. If a designer wants to have flexibility to change VDD 516 to another voltage and/or to change OVDD 514 to another voltage, use the IC in a different application, or add different peripherals to the system having different OVDDs, then the statically designed circuit 500 of FIG. 1 will not compensate for these changes in OVDD whereby the trigger point will not be properly set. Improperly set trigger points will greatly reduce the speed of operation of the circuit and may, in some circumstances, render the circuit of FIG. 1 completely inoperable. For example, in the circuitry of FIG. 1, if (OVDD−Vt) were to be substantially less than VDD, the circuitry of FIG. 1 may not even be able to pass a logic 1 from the chip pad 512 to the internal gates 518. In this case, the circuitry of FIG. 1 is completely nonfunctional. In essence, since the trigger point of FIG. 1 is only a function of VDD and not OVDD and that trigger point can be greater than (OVDD−Vt), flexibility in system level design by changing VDD and/or OVDD is greatly reduced and multiple ICs must be custom designed for differing VDD and OVDD combinations.

In addition, in some OVDD and VDD cases, the circuitry of FIG. 1 will result in a trigger point that is located where the noise margins that result are not adequate. In these cases, erroneous signals or great degradation in performance may occur whereby the circuitry of FIG. 1 is not desirable.

Therefore, a need exists in the industry for an input buffer that has one or more of: (1) a balanced output inverter structure; (2) a trigger point that can varies only as a function of OVDD 514); (3) a trigger point designed to have optimal noise margins; and/or (4) the ability to always pass functional high and low logic values regardless of the relationship between OVDD and VDD.

Figure 1:
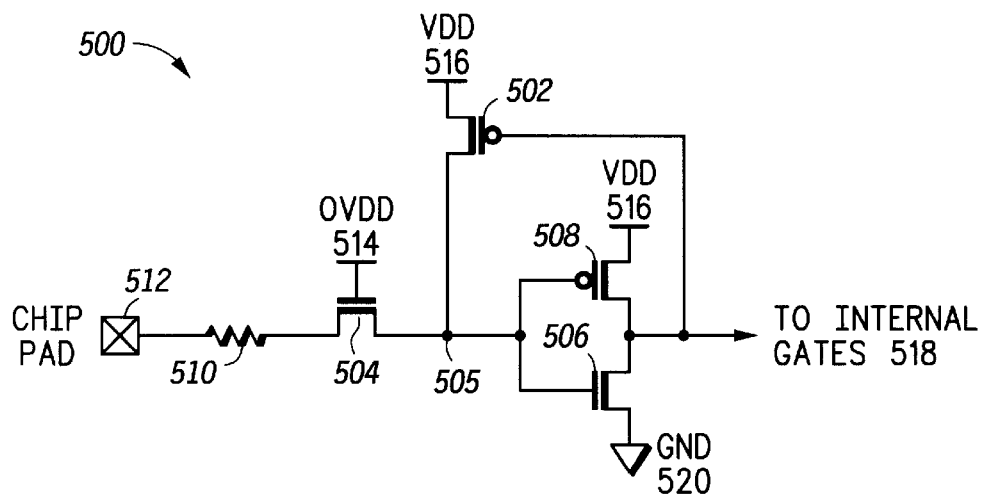
FIG. 1 illustrates, in a circuit diagram, a prior art input buffer which is used in the integrated circuit (IC) industry.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is an input buffer and method of operation that has a self-adjusting trigger point and high performance. First, the input buffers taught herein can interface with high voltages even though the input buffer is manufactured using a low voltage process. The low voltage process allows higher speeds to be obtained. In addition, the input buffers taught herein have a trigger point that is dynamically adjusted based upon the externally-used VDD of a connected peripheral (referred to as OVDD). Since the trigger point automatically adjusts based upon the OVDD voltage level, the integrated circuit which contains the input buffers taught herein can be coupled to any type of peripheral having any one of many different types of voltage supply levels and still function in an optimal manner. Also, the input or I/O buffers used herein will have a balanced inverter that drives the internal gates whereby the speed of the buffer is symmetrical for the zero-to-one rising transition as well as the one-to-zero falling transition. Since the trigger point automatically adjusts for any attached OVDD, the circuitry designed herein is much more flexible in application than the prior art. The circuit taught herein ensures that logic levels of zero and one will be functionally passed from the input pad to the internal gates regardless of the relationship between OVDD and VDD, unlike the prior art. In addition, since the trigger point is automatically adjusted to an optimal mid level, the noise margins of the circuits discussed herein are superior to the noise margins of statically set trigger point prior art input buffers.

According to one aspect of the present invention, an input buffer includes an input pad adapted to receive an input signal, a first circuit coupled to the input pad, the first circuit adapted to receive the input signal from the input pad. The first circuit includes a reference voltage generator and an inverter coupled to the reference voltage generator. The inverter is adapted to receive an external voltage and has a trigger point wherein the trigger point is a function of the external voltage. The input buffer includes a level shifter coupled to the inverter, and adapted to receive a first supply voltage. The level shifter provides an internal voltage indicated by the input signal, wherein the internal voltage is less than the external voltage. The input buffer includes a first device having a first node adapted to receive the external voltage, a second device having a second node coupled to a second supply voltage, a first protection circuit coupled to the first device and coupled to the input pad. The first protection circuit is adapted to protect the first device from low voltages and is coupled to the reference voltage generator. The input buffer further includes a second protection circuit coupled to the second device and coupled to the input pad. The second protection circuit adapted to protect the second device from high voltages. The second protection circuit coupled to the reference voltage generator.

According to another aspect of the present invention, an enable circuit coupled to the first circuit and to the level shifter, wherein the enable circuit is adapted to enable the input buffer to receive the input signal and convert the input signal to the internal voltage. When disabled the enable circuit forces the level shifter to provide the internal voltage at a predetermined voltage level.

The circuitry and methodologies taught herein can best be understood with reference to FIGS. 2–7.

Figure 2:
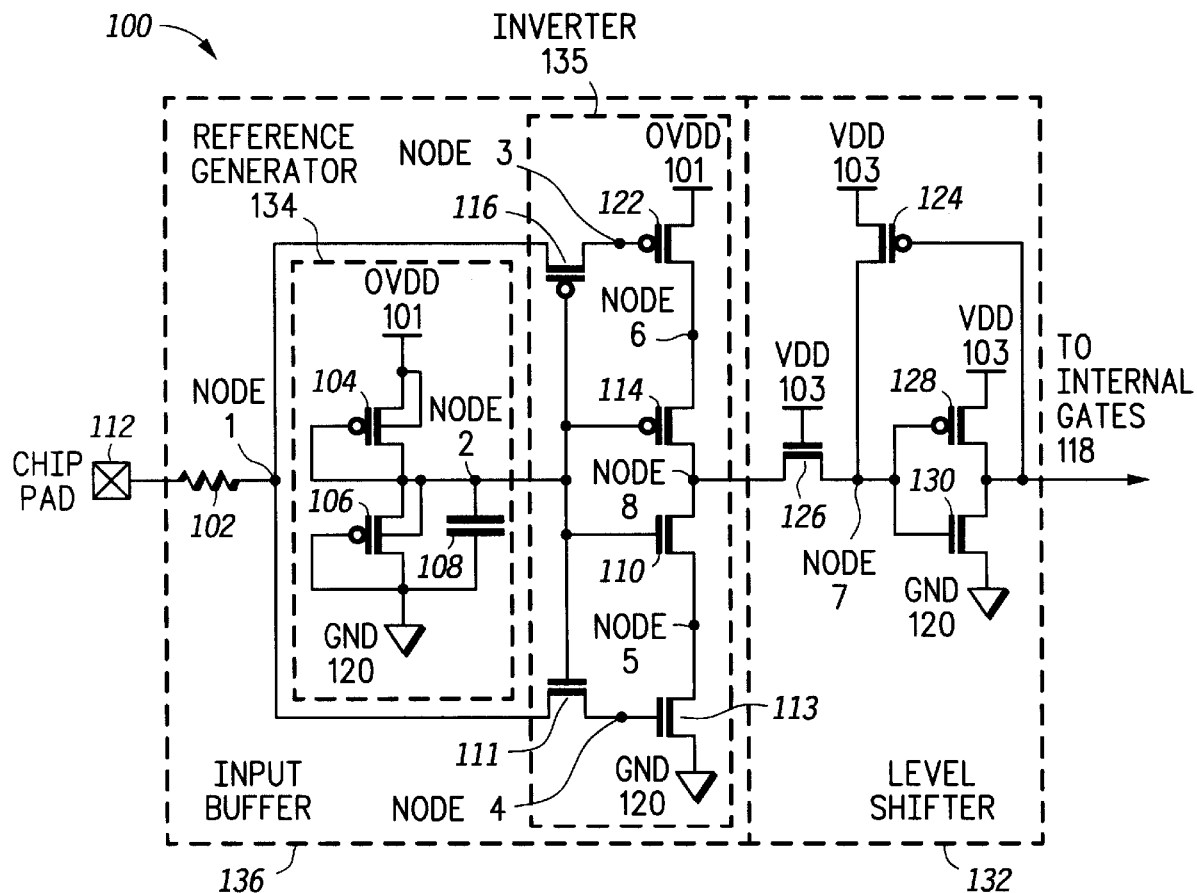
FIG. 2 illustrates, in a circuit diagram, an input buffer in accordance with the present invention.

FIG. 2 illustrates, in a circuit schematic, an input buffer 100 which is a small component of a larger integrated circuit, according to one embodiment of the present invention. The circuit 100 of FIG. 1 contains two primary components. A first component is an input buffer circuit 136 and a second component is a level shifter 132. Generally, the input buffer 136 will receive an input signal from a chip pad 112 which is located on an external periphery of the integrated circuit. The input buffer 136 contains circuitry that is coupled to OVDD 101. OVDD 101 is the voltage provided by an external power supply, where OVDD 101 is used by the external device (not illustrated in FIG. 2) that is driving the input data onto the chip pad 112. Generally, OVDD 101 in FIG. 2 is one or more of roughly 5 volts, roughly 3.3 volts, roughly 2.5 volts, or roughly 1.8 volts when using a silicon based CMOS integrated circuit design.

The input buffer 136 generally contains two primary subcomponents. These two primary subcomponents are a reference voltage generator 134 and an inverter 135. Generally, the reference voltage generator 134 receives, as an input, the signal OVDD 110. The reference generator 134 will provide an output signal on to a node 2 which is roughly OVDD/2. In essence, the circuit 134 is a voltage divider, conductive voltage supply lines, or a voltage generator of some sort. The output voltage of OVDD/2, which is provided on node 2 by the circuit 134, is provided as input to the inverter 135. The OVDD/2 input to circuit 135 will bias the inverter 135 protects devices 122 and 113. The transistors 122, 114, 110, and 113 are sized to set an optimal trigger point for inverter 135. In combination with reference generator 134, the trigger point of inverter 135 will self-adjust in response to changes in OVDD 101 at a trigger point that is roughly half-way between OVDD 101 and ground 120. The inverter 135 generally operates around that trigger point to provide the input data bit from chip pad 112 to an internal node 8 with a signal inversion. Therefore, in summary, the input buffer 136 generally adjusts its trigger point in a dynamic manner to compensate automatically for any OVDD value used external to the IC, whereby input data signals from the chip pad 112 are optimally provided to an internal node 8 of the circuit 100 using an adjusted/optimal trigger point.

After the input buffer 136 provides an output signal via a node 8 in FIG. 2, the signal on node 8 is an input to level shifter 132 and is processed by level shifter circuit 132. Generally, the level shifter 132 receives as input a VDD value 103 which is the power supply voltage for the integrated circuit that contains the input buffer 100. Generally, VDD can be any one of roughly 5 volts, roughly 3.3 volts, roughly 2.5 volts, roughly 1.8 volts, or any other common VDD supply voltage level used in the integrated circuit industry. VDD depends on the substrate material used, the type of technology used (CMOS, JFET, BiCMOS, bipolar, MESFET, etc.), desired power consumption, and other factors. Generally, for a silicon and CMOS process, some voltage level between roughly 1 volt and roughly 10 volts will be a voltage used for the values OVDD 101 and VDD 103. While OVDD 101 and VDD 103 may be the same voltage (e.g., both 2.5 volts), generally, the two voltages OVDD 101 and VDD 103 are different voltage values (e.g., one 5 volts and the other 1.8 volts). The level shifter 132 will take the different voltage range of ground (GND) to OVDD and convert it to an internal signal 118 that operates in the voltage range of ground 120 to VDD 103. It is important to indicate that the entire circuit 100 will operate in a manner whereby no transistor in FIG. 2 is significantly exposed to over voltage values whereby a low voltage process may be used to make the circuit 100. The low voltage processing of the circuit of FIG. 2 along with the overvoltage protection will allow both reliability and performance to be maximized.

In a common mode of operation, an input voltage signal somewhere between ground 120 and OVDD 110 is provided by an external device or peripheral to the integrated circuit chip pad 112 of FIG. 2. This signal will propagate through a resistive device 102, which may be parasitic resistant, a resistive device specifically fabricated on an integrated circuit die, or some combination thereof. Therefore, the resistor 102 provides some delayed form of the input data signal from chip pad 112 to a node 1 in FIG. 2.

Node 1 of FIG. 2 provides the data input signal to a P-channel MOSFET 116 and an N-channel MOSFET 111. Since the gate electrodes of transistors 111 and 116 are powered by the reference voltage generator 134, the reference voltage generator 134 is now discussed.

Reference generator 134 contains two P-channel transistors 104 and 106 and a capacitor 108. Circuit 134 receives as input the OVDD signal 101 from a chip pad not illustrated in FIG. 2, and circuit 134 receives a ground signal 120 from yet another chip pad which is also not illustrated in FIG. 2. Generally, the transistors 104 and 106 are balanced transistors of the same size and form a voltage divider between OVDD 101 and ground 120. Therefore, the node 2 of FIG. 2 is biased at a voltage roughly half way between OVDD 101 and ground 102. In addition to providing a voltage division function, the circuit 134 contains a capacitor 108 which is used to lower the alternating current (AC) impedance of the circuit in FIG. 2.

It is important to note that the bias generator circuit 134 of FIG. 2 may be a separate circuit for each and every input buffer 100 within the integrated circuit. In yet another form, one reference voltage generator 134 may be shared by two or more input chip pads 112 to conserve on silicon surface area whereby node 2 becomes a bus connection that is shared between two or more input pads. In yet another embodiment, the reference generator 134 may be a single circuit used for the whole IC where one circuit 134 powers all input buffer reference nodes 2 for all input buffers in the IC. in this embodiment, node 2 will be a bus connection that is communicated around the entire periphery of the integrated circuit die. In summary, the reference voltage generator 134 is any circuit that can provide a reference voltage on node 2 which is roughly OVDD/2 or a like voltage that properly biases transistors 116, 114, 110, and 111. For the specific circuit shown in FIG. 2, the gate biases on transistors 116, 114, 110 and 111 are roughly OVDD/2.

Returning to transistors 116 and 111, node 1 will provide an input signal, which is typically a logic signal that is one of either roughly OVDD or roughly a ground (GND) potential, to the transistors 116 and 111. The transistor 116, with its gate tied to OVDD/2 via node 2, keeps the node 3 of FIG. 2 from going below OVDD/2 plus Vt (OVDD/2+Vt) when the chip pad 112 is at or below (OVDD/2+Vt), thereby protecting the transistor 122 from an over voltage value. The transistor 111 in FIG. 2, with its gate tied to OVDD/2 via node 2, keeps the node 4 from rising above (OVDD minus Vt (OVDD/2−Vt), thereby protecting transistor 113 from an over voltage occurrence. An overvoltage occurrence is when a gate-to-channel voltage of a transistor exceeds the breakdown voltage of the gate oxide within that transistor whereby the gate oxide may be severely damaged. Generally, the breakdown voltage of a transistor is slightly higher than the operational VDD, whereby if OVDD is much greater than VDD, the protection transistors of FIG. 2 are very advantageous. Therefore, the transistors 111 and 116 efficiently pass the input voltage on node 1 in a manner that protects the respective transistors 122 and 113 from an over voltage event.

Generally, all of the transistors 122, 114, 110, 111, 116, and 113 form an inverter which passes an inverted representation of the input signal from node 1 to the internal node 8. Inverter 135 includes two protection circuits. A first protection circuit includes devices 116 and 114, and protects device 122. A second protection circuit includes devices 110 and 111, and protects device 113. Since the protection transistor 114 has a gate that is biased to roughly OVDD/2, the transistor 114 prevents a voltage on node 6 in FIG. 2 from obtaining a ground potential 120 when node 8 of FIG. 2 is being biased to ground 120. In short, the transistor 114 protects itself and the transistor 122 from an over voltage event. In addition, transistor 110 also has a gate that is coupled to OVDD/2 which prevents node 5 in FIG. 2 from obtaining an OVDD level when node 8 is biased at roughly the OVDD voltage. In short, transistor 110 protects itself from an over voltage event, and transistor 110 also protects transistor 113 from an over voltage event. Altogether, the transistors 116,122,114,110,113, and 111 provide over voltage protection and perform an inversion function on the input signal at node 1 and provide an inverted output signal to node 8 that represents the input data provided via pad 112.

One advantage of the circuit 136 is that the reference generator 134 allows for self-adjustment of the trigger point of the inverter 135 as a function of OVDD 101. Therefore, a system level designer can connect the integrated circuit that contains input buffer circuit 100 to any OVDD-powered external peripheral where the circuit 100 will automatically adjust its trigger point to obtain optimal speed and performance for that OVDD.

In FIG. 2, the output node 8 of circuit 136 is most likely providing a voltage value that may be outside the voltage range of ground 120 to VDD 103 or may be providing a voltage range less than the rail voltages, GND to VDD. For this reason, the level shifter circuit 132 of FIG. 2 is coupled to the node 8 to translate the voltage range of node 8 to a voltage range within GND to VDD for use by VDD-powered circuitry internal to the IC. Generally, the level shifter 132 will convert the voltage ranges on node 8 from a voltage range based on OVDD 101 to a voltage range based on VDD 103 which is compatible with structure of the gates 118 within the integrated circuit. A transistor 126 in FIG. 2 has a gate electrode that is biased to VDD 103. Therefore, transistor 126 prevents a voltage at node 7 from obtaining a value close to OVDD 101 thereby protecting transistors 128 and 130 from an over voltage event. The transistors 128 and 130 are connected to both VDD 103 and ground 120 to form an inverter. This inverter, formed by devices 128 and 130, receives the protected voltage on node 7 as input and provides an inversion of this input voltage to a node 118 that lies within the operational range of ground 120 to VDD 103.

In FIG. 2, a feed back transistor 124 is connected between VDD 103 and node 7 and has a gate biased by the output 118. In the event that (OVDD−Vt) is substantially less than VDD in FIG. 2, the transistor 124 will ensure that the node 7 obtains proper operational voltages with respect to VDD so that the inverter comprising transistors 128 and 130 can be fully turned on and fully turned off given any input voltage at node 8. It is important to note that the transistors 128 and 130 can be sized so that the two transistors are symmetrical around a central trigger point. In other words, the trigger point of the inverter containing gates 128 and 130 can be centrally set whereby noise margins are improved and rise time and fall times are symmetrical whereby worse case performance is improved over the prior art.

It is also important to note that the circuit 100 of FIG. 2 has protected nodes 3, 4, 5, 6, and 7 that cannot obtain severe over voltages whereby the entire circuit 100 may be formed by a low voltage process to enhance performance whereby reliability should not be diminished.

Therefore, FIG. 2 illustrates an input buffer circuit that has a balanced input inverter 128 and 130 which has an optimal middle trigger point between VDD and ground whereby noise margins are optimized, and rise and fall times are also optimized for any OVDD. In addition, the circuit 100 of FIG. 2 is self adjusting as VDD and OVDD are connected to different potentials whereby an integrated circuit that uses the input buffer of FIG. 2 is much more flexible in system level designs than integrated circuits using the prior art input buffers of FIG. 1. As the voltage levels OVDD and VDD are changed for the circuit 100 of FIG. 2, performance levels are not degraded to the extent performance levels of FIG. 1 would be degraded, since FIG. 2 is self adjusting. In addition, the input buffer 100 of FIG. 2 is guaranteed to pass a logic zero or a logic one over a wider range of OVDD and VDD unlike the circuit of FIG. 1. In addition, the circuit of FIG. 100 may greatly improve the applications in which an integrated circuit can be designed into, and may greatly reduce design time of an integrated circuit. If one were to use the prior art FIG. 1 for all IC devices, they may need to design a different input buffer for each and every different combination of OVDD and VDD used in the market in order to obtain optimal performance points. Such redesign and effort is not the case when using the circuit 100 of FIG. 2. Therefore, the circuit of FIG. 2 is generally superior to the circuit 500 illustrated in FIG. 1.

Figure 3:
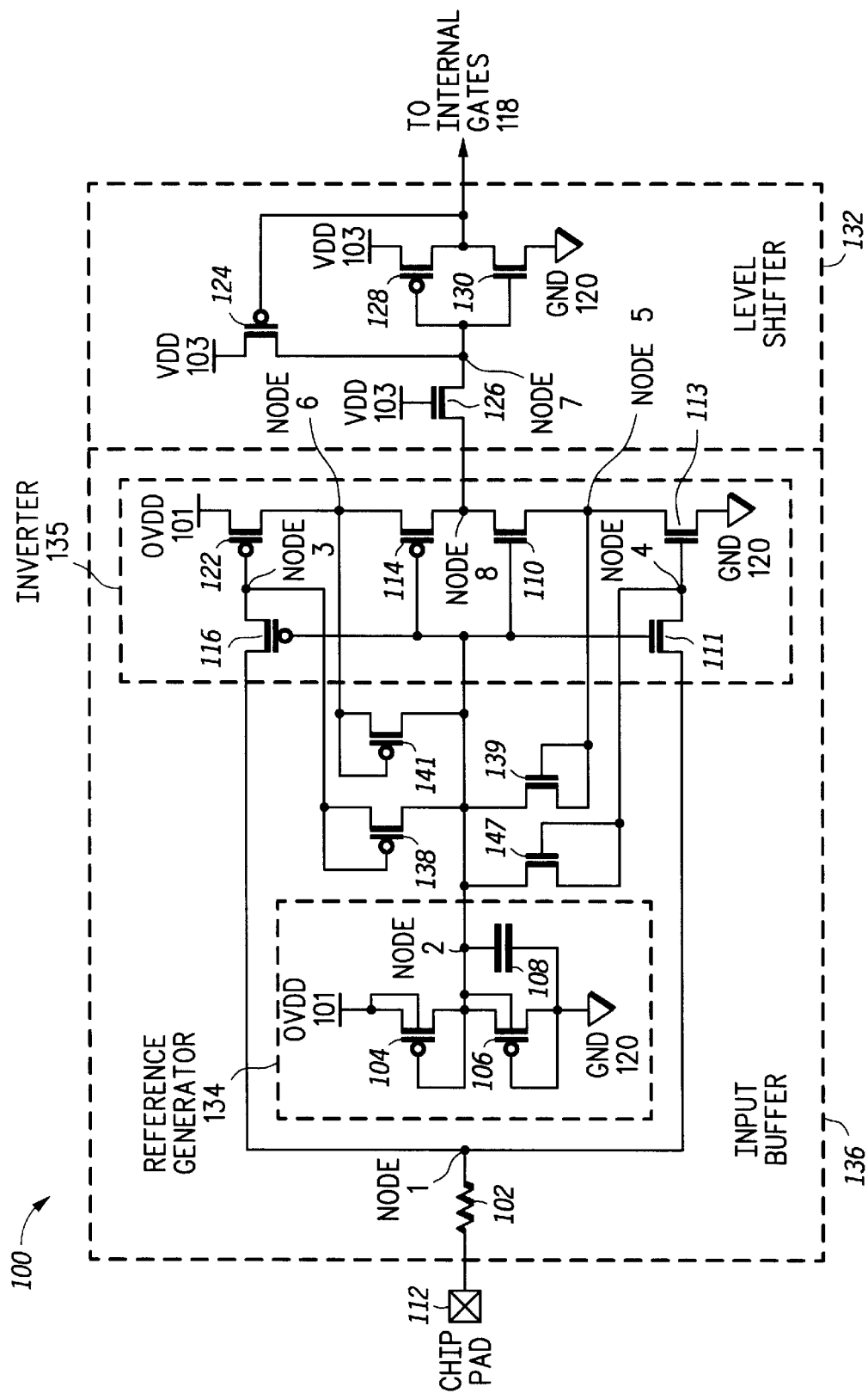
FIG. 3 illustrates, in a circuit diagram, optional circuit elements and circuit connections that can be added to FIG. 2 to improve functionality of FIG. 2 in accordance with the present invention.

While the circuit of FIG. 2 is greatly improved over the circuit of FIG. 1, the circuitry of FIG. 2 can be optimized further in some cases. FIG. 3 illustrates some additional circuit elements and connections that can be added to FIG. 2 to enhance the performance of FIG. 2 under certain operating conditions. The circuit 100, as illustrated in FIG. 2, may be adversely affected by leakage currents, such as leakage current occurring at node 2. The circuit 100 may also be affected adversely by capacitive coupling between adjacent polysilicon or metal routing (also referred to as cross talk). The harmful effects of cross talk and leakage current can be compensated for and/or entirely prevented by making some small changes and/or additions to the design of FIG. 2 as illustrated in FIG. 3.

Specifically, FIG. 3 illustrates a MOSFET 138 and a MOSFET 141 that are both configured as a diode. These diode connected MOSFETs 138 and 141 have one electrode coupled to the node 2 in FIG. 3. The other electrode of MOSFET 138 is connected to node 3, and a second electrode of MOSFET 141 is coupled to node 6 in FIG. 3. As previously discussed, node 2 which is output from the reference generator circuit 134 can be tied as a bus among multiple input buffers. In another form, as will be shown later in FIG. 4, the reference generator could be another circuit design which supplies fixed voltages to the transistors 116, 114, 110, and 111 without using a voltage divider circuit as in FIG. 2. The requirement is simply that the node 2 is set to some voltage that prevents the devices 122 and 113 from being damaged by over voltage events during operation. Such protection can be obtained in many different ways as clearly indicated in FIGS. 2–7. On node 2, leakage current and/or cross talk could be significant. The diode-configured devices 138 and 141 are used to compensate for the leakage current and/or capacitive coupling between adjacent conductive members in the integrated circuit design in a manner that is likely improve the performance of the circuit 100.

In a similar manner, transistors 139 and 147 may also be added to the circuit 100 as shown in FIG. 3. MOSFETs 139 and 147 are also configured as diodes and are connected to node 2 of FIG. 2. The MOSFET 139 has a second current electrode coupled to node 5 while MOSFET 147 has a second current electrode coupled to node 4. As with transistors 138 and 141, transistors 139 and 147 will protect the circuit 100 from adverse effects of leakage current and/or cross talk between adjacent conductive elements. It is important to note that transistors 138, 141, 147, and 139, while improving performance in certain circumstances, are not absolutely required in the design of FIG. 2 and are optional features.

According to one embodiment, the input buffer 100 includes a first clamping circuit coupled between a first device 122 and the reference voltage generator 134. The first clamping circuit is adapted to prevent a first node of the first device 122 from dropping below a predetermined voltage. The input buffer 100 also includes a second clamping circuit coupled between the first device 122 and the reference voltage generator 134, wherein the second clamping circuit is adapted to prevent a second node of the first device 122 from dropping below a predetermined voltage. The input buffer further includes a third clamping circuit coupled between the second device 113 and the reference voltage generator 134, the third clamping circuit adapted to prevent a first node of the second device 113 from rising above a predetermined voltage. The input buffer 100 also includes a fourth clamping circuit coupled between the second device 113 and the reference voltage generator 134, the fourth clamping circuit adapted to prevent a second node of the second device 113 from rising above a predetermined voltage.

Figure 4:
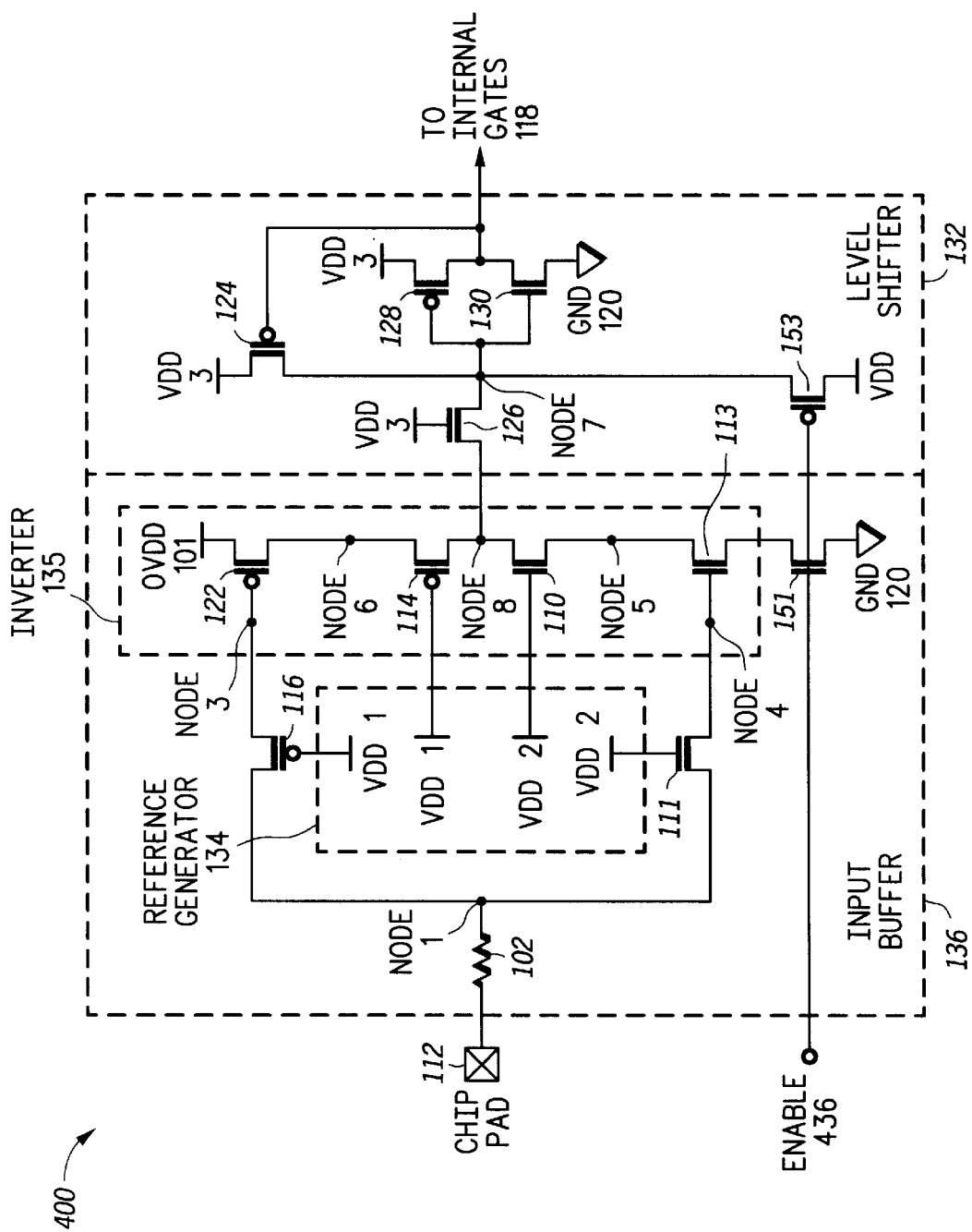
FIG. 4 illustrates, in a circuit diagram, the circuit of FIG. 2 with an input buffer enable control option in accordance with the present invention.

FIG. 4 illustrates the circuit of FIG. 2 with small, yet significant, differences. First, FIG. 4 indicates that the reference generator 134 of FIG. 2 may be replaced by a different reference generator circuit 434 which provides different gate voltages to the transistors 116, 114, 110, and 111. Specifically, reference generator 434 of FIG. 4 provides a VDD1 signal and a VDD2 signal as indicated. VDD1 is provided as a gate signal to the transistors 116 and 114. VDD2 is provided as a gate signal to the transistors 110 and 111. In one embodiment, VDD1 may be equal to VDD2, whereas in other embodiments, the two voltages VDD1 and VDD2 may be different potentials. These voltages VDD1 and/or VDD2 may be generated internal to the integrated circuit from one or more of OVDD and/or VDD3, or the voltages VDD1 and/or VDD2 may be independent voltages generated by different sources external to the integrated circuit. In any event, the circuit 400 of FIG. 4 and the circuit 100 of FIG. 2 indicates that the reference generator circuits taught herein may be any one of several circuits that perform the operation of biasing the protection transistors 116, 114, 110, and 111 in any manner that protects the transistors 122 and 113 from over voltage events. As clearly indicated by FIGS. 2 and 4, such protection objectives can be obtained in many different interchangeable manners.

In addition, FIG. 4 illustrates that the level shifter 132 is biased by a voltage VDD3. In one form, VDD3 may be a completely different voltage from either one of VDD1 or VDD2. However, VDD3 may be either equal to VDD1 or VDD2 or may be equal to both VDD1 and VDD2. Therefore, VDD3 may be an internally generated signal from one or more of VDD1 or VDD2 or may be a signal provided by an external pin of the integrated circuit.

While the above two changes indicated by reference generator 434 and the presence of VDD3 are significant, the major change in circuit 400 as compared to circuit 100 of FIG. 2 is indicated in the bottom of FIG. 4. FIG. 4 specifically illustrates that an input buffer enable signal 436 may be provided to the input buffer 400. This signal 436 is connected to gate electrodes of transistors 151 and 153 in FIG. 4. When the enable signal is deactivated, the transistor 151 will turn off whereby the inverter 135 of FIG. 4 will be tristated from operation. In addition, the transistor 153, in response to a low enable signal, will clamp the node 7 to the value VDD3. In essence, the enable signal 436 along with the transistors 151 and 153 will enable the input buffer 400 to be selectively enabled and disabled based upon intelligent CPU control.

Figure 5:
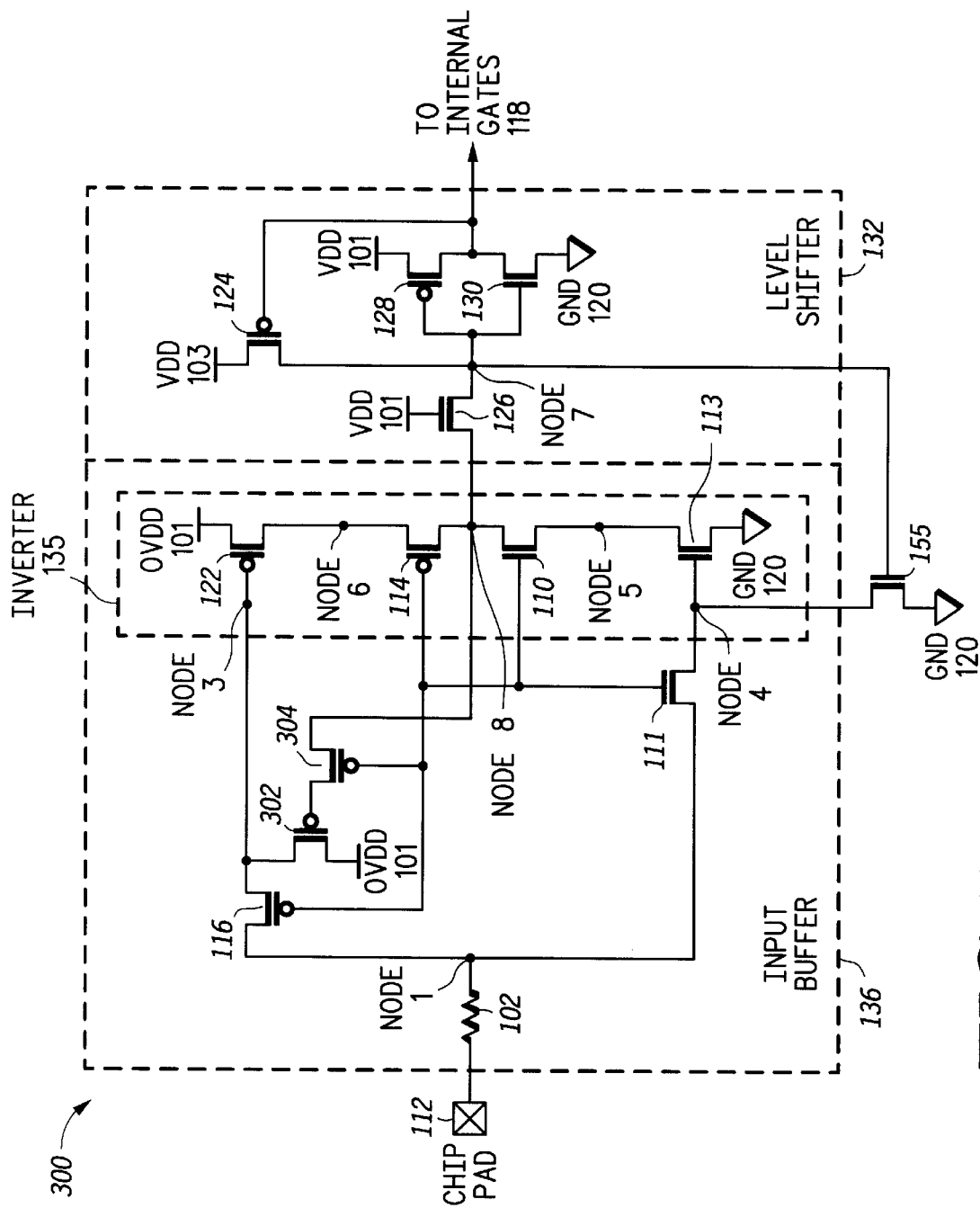
FIG. 5 illustrates, in a circuit diagram, a Schmitt trigger input buffer similar to FIG. 2 which may be used in accordance with the present invention.
Figure 6:
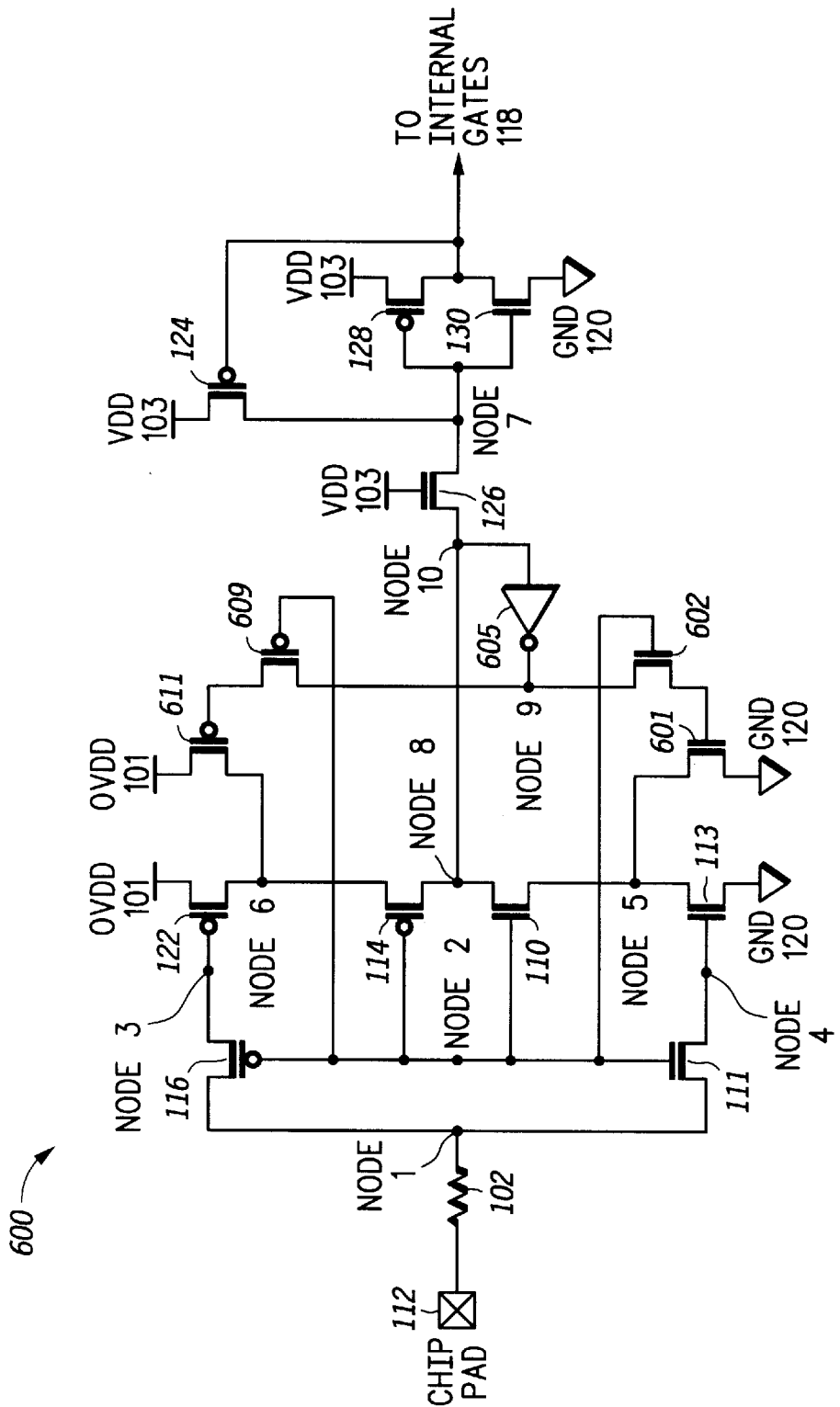
FIG. 6 illustrates, in a circuit diagram, yet another Schmitt trigger input buffer similar to FIG. 2 which may be used in accordance with the present invention.

Generally, FIGS. 5 and 6 illustrate how the circuit of FIG. 2 can be converted to form Schmitt trigger input buffers. Specifically with respect to FIG. 5, a large portion of FIG. 5 is identical to FIG. 2 as indicated by identical reference numerals. One difference in FIG. 5 is that a feed back transistor 155 has been connected between node 7 and node 4 of FIG. 5. In addition, transistors 304 and 302 have been connected between node 3, and node 8 as illustrated. The presence of these new transistors 155, 302, and 304 convert the input buffer of FIG. 2 to a Schmitt trigger input buffer which operates in a manner very similar to that previously discussed for FIG. 2. Note that the reference generator 134 is not illustrated in FIG. 5, but is coupled to node 2.

FIG. 6 illustrates yet another Schmitt trigger device which can be derived from the circuit illustrated in FIG. 2 and discussed with respect to FIG. 2. The device of FIG. 6 is identical to the device of FIG. 2 with the exception that transistors 602, 601, 609, and 611 along with an added inverter 605 convert the operation of the circuit of FIG. 2 to a Schmitt trigger device. Generally, the circuit of FIG. 6 will have a trigger point that is alterable depending upon the input and/or output state of the node 1 and/or node 8. Other than this change, the operation of the circuit 600 of FIG. 6 is identical to the operation of the circuit of FIG. 2. Note that the reference generator 134 is not illustrated in FIG. 6, but is coupled to node 2.

Figure 7:
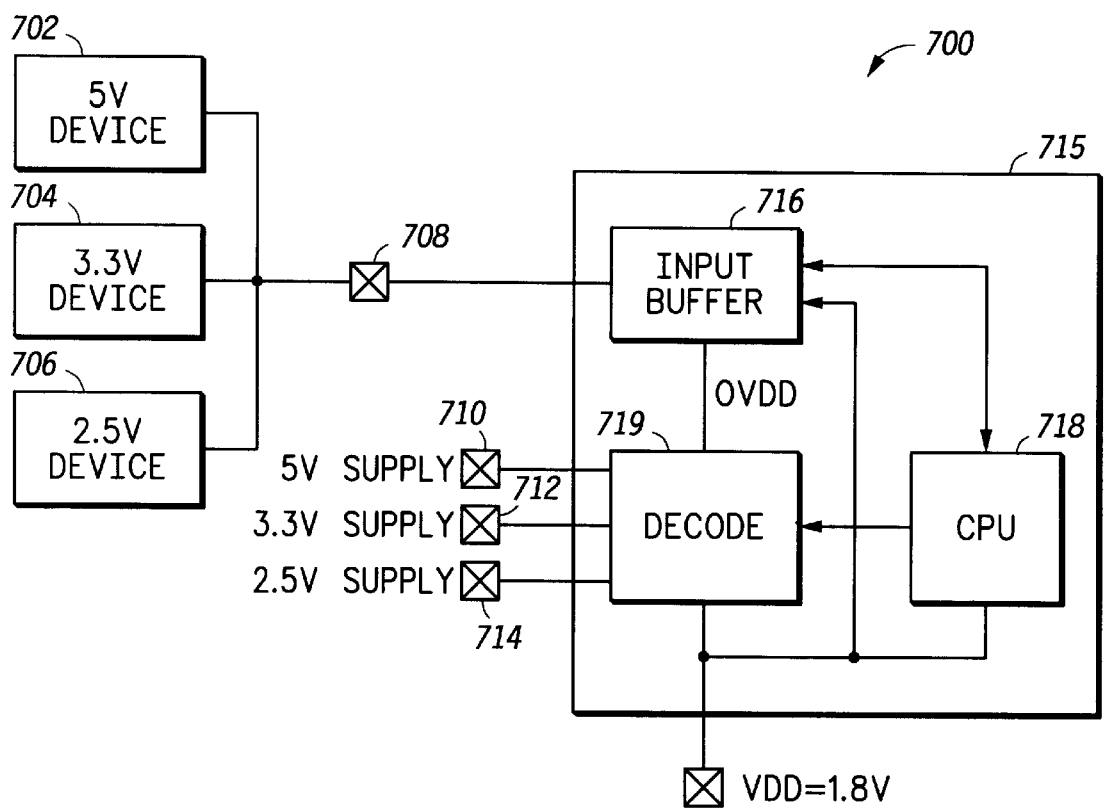
FIG. 7 illustrates, in a block diagram, a system which uses one or more of the buffers illustrated in FIGS. 2–6 in accordance with the present invention.

FIG. 7 illustrates an electrical system which utilizes one or more of the input buffer circuits illustrated in FIGS. 2–6. Specifically, FIG. 7 illustrates an electrical system 700 having four integrated circuit devices. A first integrated circuit device 702 is a peripheral device, or like integrated circuit, operating at VDD equal to 5 volts. Another external device 704 is an integrated circuit that operates using a VDD value of 3.3 volts. Another integrated circuit device 706 in FIG. 7 operates at VDD equal to 2.5 volts. In FIG. 7, yet another integrated circuit 715 operates at a voltage of 1.8 volts and has input terminals 710, 712, and 714 for receiving the 5 volt, 3.3 volt, and 2.5 volt power supplies used for devices 702, 704, and 706.

Generally, FIG. 7 illustrates a single input connection between the devices 702–706 and the integrated circuits 715 through a pin 708. In other words, the devices 702, 704, and 706 are time multiplexed onto a single conductive line which is coupled to the input buffer 716 of FIG. 7. While FIG. 7 illustrates a single bit connection between the integrated circuits 702 and 706 and the device 715, the concept of FIG. 7 can easily be extended to an entire bus connected between the integrated circuits of FIG. 7.

In FIG. 7, a CPU 718 will request information from external to the integrated circuit 715. This information will be communicated external to the integrated circuit to the devices 702, 704, and 706. Given that each device 702–706 is accessed using a unique access space, a decode circuit 719 will be able to determine which external device will be supplying the information. Once the decode circuit 719 determines which device will provide what information, the decode circuit 719 can provide a corresponding internal OVDD value to the input buffer 716 which is one of 5 volts, 3.3 volts, or 2.5 volts, corresponding to the devices 702–706. For example, if the CPU 718 is requesting information from device 702, then the decoder 719 will provide 5 volts as OVDD to the buffer 716. If, on the other hand, device 706 is selected by the CPU 718 to input data to integrated circuit 715, then the decoder 719 will provide 2.5 volts as OVDD in FIG. 7. Therefore, when the circuit 716 is implemented as any circuit illustrated in FIGS. 2–6, the input buffer 716 can dynamically change its trigger point to optimally accommodate any OVDD value used by any number of external peripheral 702–706 in a dynamic manner. Such dynamic adjustment of a single input buffer 716 to accommodate multiple different OVDD devices connected to the same buffer is not possible in the prior art.

The present invention provides an input buffer having a balanced output inverter structure, and a trigger point that can varies only as a function of OVDD 514. Further the present invention provides an input buffer where a trigger point is designed to have optimal noise margins, and having the ability to always pass functional high and low logic values regardless of the relationship between OVDD and VDD.

What is claimed is:

1. An input buffer comprising:
   an input pad coupled to receive an input signal;
   a first circuit coupled to the input pad, the first circuit coupled to receive the input signal from the input pad, the first circuit comprising:
      a reference voltage generator;
      an inverter coupled to the reference voltage generator, the inverter coupled to receive an external voltage, the inverter having a trigger point which is a function of the external voltage, the inverter comprising:
         a first device having a first node coupled to receive the external voltage;
         a second device having a second node coupled to a second supply voltage;
         a first protection circuit coupled to the first device and coupled to the input pad, the first protection circuit coupled to protect the first device from low voltages, the first protection circuit coupled to the reference voltage generator, and
         a second protection circuit coupled to the second device and coupled to the input pad, the second protection circuit coupled to protect the second device from high voltages, the second protection circuit coupled to the reference voltage generator; and
      a level shifter coupled to the inverter, the level shifter coupled to receive a first supply voltage, the level shifter providing an internal voltage indicated by the input signal, wherein the internal voltage is less than the external voltage.

2. The input buffer of claim 1, wherein:
   the reference voltage generator generates a first reference voltage; and
   the reference voltage generator provides the first reference voltage to the first and second protection circuits.

3. The input buffer of claim 1, wherein:
   the reference voltage generator generates a first reference voltage and a second reference voltage; and
   the reference voltage generator provides the first reference voltage to the first protection circuit and provides the second reference voltage to the second protection circuit.

4. The input buffer of claim 1, further comprising:
   an enable circuit coupled to the first circuit and to the level shifter, the enable circuit coupled to enable the input buffer to receive the input signal and convert the input signal to the internal voltage, when disabled the enable circuit forces the level shifter to provide the internal voltage at a predetermined voltage level.

5. The input buffer of claim 4, wherein when disabled the enable circuit isolates the second device of the inverter from the second supply voltage.

6. The input buffer of claim 1, further comprising:
   a first clamping circuit coupled between the first device and the reference voltage generator, the first clamping circuit coupled to prevent a first node of the first device from dropping below a predetermined voltage; and
   a second clamping circuit coupled between the first device and the reference voltage generator, the second clamping circuit coupled to prevent a second node of the first device from dropping below a predetermined voltage.

7. The input buffer of claim 1, further comprising:
   a third clamping circuit coupled between the second device and the reference voltage generator, the third clamping circuit coupled to prevent a first node of the second device from rising above a predetermined voltage; and
   a fourth clamping circuit coupled between the second device and the reference voltage generator, the fourth clamping circuit coupled to prevent a second node of the second device from rising above a predetermined voltage.

8. The input buffer of claim 1, wherein the first and second devices are transistors, and wherein the first protection circuit comprises:
   a first transistor coupled to a control node of the first device; and
   a second transistor coupled to a second node of the first device.

9. The input buffer of claim 8, wherein the second protection circuit comprises:
   a third transistor coupled to a control node of the second device; and
   a fourth transistor coupled to a first node of the second device.

10. The input buffer of claim 9, wherein the second transistor is coupled to the fourth transistor at a node.

11. The input buffer of claim 10, wherein the level shifter comprises:
    an output node for providing the internal voltage;
    a fifth transistor coupled to the node;
    a sixth transistor coupled to the fifth transistor and coupled to the output node;
    a seventh transistor coupled to the sixth transistor and coupled to the output node; and
    an eighth transistor coupled to the seventh transistor and coupled to the output node.

12. The input buffer of claim 11, wherein the reference voltage generator comprises:
    an reference node coupled to the first and second protection circuits;
    a ninth transistor coupled to receive the external voltage, the ninth transistor coupled to the reference node;
    a tenth transistor coupled to the ninth transistor and coupled to the reference node; and
    a capacitor coupled to the tenth transistor and coupled to the reference node.

* * * * *